United States Patent [19]

Roberts et al.

[11] Patent Number: 5,096,934
[45] Date of Patent: Mar. 17, 1992

[54] PACKAGING MATERIAL CONTAINING INHERENTLY ANTISTATIC POLYMERIC FOAM AND METHOD FOR USE THEREOF

[75] Inventors: William P. Roberts, Columbus; Cynthia L. Ebner, Silver Spring; Timothy G. Grasel, Laurel, all of Md.

[73] Assignee: W. R. Grace & Co.-Conn., New York, N.Y.

[21] Appl. No.: 410,775

[22] Filed: Sep. 21, 1989

[51] Int. Cl.$^5$ .................. C08G 18/12; C08J 9/08; C08L 75/04

[52] U.S. Cl. .................. 521/159; 521/137; 521/156; 521/86

[58] Field of Search ............. 521/159, 137, 156, 86

[56] References Cited

U.S. PATENT DOCUMENTS

| | | | |
|---|---|---|---|
| 3,790,508 | 2/1974 | Triolo | 521/160 |
| 3,810,956 | 5/1974 | Kimura et al. | 525/424 |
| 3,903,232 | 9/1975 | Wood et al. | 521/159 |
| 3,933,697 | 1/1976 | Fujii et al. | 521/55 |
| 3,959,191 | 5/1976 | Kehr et al. | 428/314 |
| 4,093,676 | 2/1978 | Weipert et al. | 524/239 |
| 4,137,200 | 1/1979 | Wood et al. | 521/159 |
| 4,231,901 | 11/1990 | Berbeco | 252/511 |
| 4,258,137 | 3/1981 | Cogliano | 521/137 |
| 4,293,679 | 10/1981 | Cogliano | 528/72 |
| 4,301,040 | 11/1981 | Berbeco | 252/511 |
| 4,309,509 | 1/1982 | Wood | 521/137 |
| 4,314,034 | 2/1982 | Fulmer et al. | 521/65 |
| 4,321,297 | 3/1982 | Adelman | 428/238 |
| 4,379,913 | 4/1983 | Waitkus | 528/300 |
| 4,578,406 | 3/1986 | Volz | 521/52 |
| 4,605,684 | 8/1986 | Pcolinsky, Jr. | 521/107 |
| 4,617,325 | 10/1986 | Knobel et al. | 521/105 |
| 4,618,630 | 10/1986 | Knobel et al. | 521/105 |
| 4,693,056 | 9/1987 | Raszewski | 53/450 |
| 4,713,399 | 12/1987 | Webb et al. | 521/110 |

FOREIGN PATENT DOCUMENTS 209385 7/1986 European Pat. Off. .

OTHER PUBLICATIONS

The Condensed Chemical Dictionary, Tenth Edition, Van Nostrand Rheinhold Co. (1981), pp. 839-840.
Polyurethane Handbook, G. Oertel, ed., Hanser Publishers, Munich (1985) pp. 106, 191, 354, 388-389.
"Protection of Electrostatic Discharge (ESD) Sensitive Devices with Urethane Foams", F. H. Sweet et al., Journal of Cellular Plastics, vol. 22, Mar., 1986, pp. 139 et seq.
"A New Additive for Electrostatic Discharge Control in Foams and Elastomers" A. Lerner, Journal of Cellular Plastics, Jan.-Feb. 1985, pp. 31-34.

Primary Examiner—John Kight, III
Assistant Examiner—John M. Cooney, Jr.
Attorney, Agent, or Firm—Valerie E. Looper; Steven T. Trinker

[57] ABSTRACT

Packaging materials containing inherently antistatic foams and a method of using the foams are disclosed. The foam used is a polyether polyurethane foam prepared from an isocyanate containing prepolymer which is the reaction product of a oxyethylene containing polyol and a polyisocyanate. The foams show surface resistivity of less than $1 \times 10^{12}$ ohms/square and static decay times of about two seconds or less. A preferred foam shows static decay times of 0.1 seconds or less. The packaging includes articles used around static sensitive devices or used to store or transport static sensitive devices.

20 Claims, No Drawings

PACKAGING MATERIAL CONTAINING INHERENTLY ANTISTATIC POLYMERIC FOAM AND METHOD FOR USE THEREOF

RELATED APPLICATIONS

This application is copending with U.S. patent application No. 410,458 to Grasel and Guthrie, entitled "Water Absorbent, High Capacity Polyurethane Foams" which discloses a foam used in one of the preferred embodiments disclosed herein

BACKGROUND

A. Field of the Invention

The field of the invention generally relates to the use of antistatic polymeric materials, especially polyurethane foams, to package, store, etc., electrostatic sensitive apparati, devices, etc.

B. Prior Art

Accumulation of electrostatic charges on polymeric materials has been a long standing problem when using such materials in and around electrostatic sensitive environments or devices. One type of polymeric material which undergoes buildup of static charges is polyurethane foam.

For instance, polyurethane foams have been used in environments where electronic components or devices may be subject to a static charge. In some applications the foams are used to cushion and protect packaged electronic components or devices, wherein troublesome charges are usually either generated by people handling the devices or by the environment itself. Typically, charges will accumulate on the foam during shipping, transporting, or otherwise moving the electronic components from place to place. Moreover, the synthetic materials which are used for floor covering, as well as wearing apparel for production workers, are subject to rapid static-charge buildup. Likewise, other activity during the normal course of business in shipping electronic components and devices may generate static charges. See U.S. Pat. Nos. 4,231,901 and 4,301,040 to Berbeco.

In environments described above, 100 volts (V) of static charge can be easily generated and it has been found that some metal oxide semiconductor (MOS) devices can be destroyed by less than 100V of static charge. Field-effect transitors (FET) are also damaged by such charges. Further, because personnel handling such devices can easily hold over 10,000V of static charges, MOS manufacturers have been forced to utilize additional equipment and safeguard systems to prevent static-charge accumulation. For instance, MOS devices are often packaged in conductive materials, or with spring clip and conductive dual in-line sticks. These forms of packaging short or shunt the devices, so that all have the same electrical potential. Some manufacturers ship their devices with conductive leads shorted with a wire spring clip or aluminum dip stick. Such protection is also used for MOS/FET circuits, as well as microprocessor chips and various integrated circuits. See U.S. Pat. No. 4,231,901 to Berbeco.

In conjunction with the use of the safeguard systems described above, there have also been developments to provide antistatic packaging materials, e.g. foams, which are economical and easily manufactured. Acceptable antistatic standards for a variety of materials which are used in conjunction with sensitive electronic components and devices are set forth in the U.S. Military Specification MIL-B-81705B.

To impart antistatic properties to foams, conventional antistatic additives, such as carbon black, have been used. See U.S. Pat. No. 4,231,901 to Berbeco. In one manner, the additives are incorporated in the foam by coating the additives onto the foam with a binder mixture. Besides carbon black, finely-divided particles of alumina-silicate and silver, aluminum and metal salts have also been used. Graphite fibers are also known to impart antistatic properties. These particles and/or fibers have been used in some foam layers in amounts ranging from 2 to 40% by weight of the conductive layer. See U.S. Pat. No. 4,301,040 to Berbeco.

Another prior art method of imparting antistatic properties to foams comprises post treatment of the foam so that the antistatic additives interpenetrate the foam's structure. For instance, U.S. Pat. No. 4,578,406 to Volz discloses post-treating a foam with swelling agents to expand the foam's physical structure, introducing antistatic additives through expanded cells and then shrinking the foam to trap the additive in the foam's structure. The additives used by Volz are quaternary ammonium compounds such as hydroxy alkylene quaternary ammonium salts.

Another additive used to impart antistatic properties, i.e. conductivity, to foams, is a metal ionizable salt, such as sodium thiocyanate, in conjunction with an enhancer such as a phosphate ester. Foams containing these additives have been made from high molecular weight polyether polymers. Salts such as sodium tetraorganoborides have also been used with an enhancer to impart satisfactory antistatic properties. See U.S. Pat. No. 4,617,325 to Knobel et al.

However, all of the above attempts to impart antistatic properties incur problems. For example, the equipment used to protect MOS devices and FETs incurs extra costs. Post treatment of foams to impregnate the foam with antistatic additives also involves extra costs because of the additional processing used. Further, coating foams with carbon black leads to contamination problems because these additives tend to slough off during use. Antistatic additives such as Volz's quaternary ammonium compounds also tend to slough off foams and lead to contamination as well as result in non-permanent antistatic properties. See '325 patent to Knobel. See U.S. Pat. No. 4,605,684 to Pcolinsky, Jr.

SUMMARY OF THE INVENTION

Quite unexpectedly, it has been found that certain polyurethane foams suitable for packaging electrostatic sensitive devices are inherently antistatic, i.e. their surfaces are not susceptible to a buildup of electrostatic charges even without the use of antistatic additives. As evidenced by the discussion above, the prior art has focused its efforts on imparting an antistatic property to polyurethane foams by adding antistatic agents to the foam. However, up until now, additive free or unmodified polyether polyurethane foams having acceptable antistatic properties have not been found. See U.S. Pat. Nos. 4,605,684 to Pcolinsky, Jr., Column 6, lines 37–49; U.S. Pat. No. 3,933,697 to Fujii et al, Example I and Table 1; U.S. Pat. No. 4,618,630 to Knobel et al, Tables III and IV (See comparison Example No. C-5).

Accordingly, it is an object to provide novel materials for packaging and a novel method for packing static sensitive devices and apparati. The packaging material and method disclosed herein utilizes an inherently antistatic foam derived from a polyoxyethylene containing polyol having a hydroxyl functionality of at least 2 and a polyisocyanate.

It is an object of the invention to simplify packaging for static sensitive devices and apparati by using an inherently antistatic foam.

It is also an object of the invention to provide packaging which employs a foam having durable antistatic properties.

It is a further object of the invention to provide material for packaging which contains a foam substantially free of antistatic additives and does not contaminate static sensitive devices.

These and further objects will be apparent from the following detailed description.

DETAILED DESCRIPTION OF THE PREFERRED EMBODIMENTS

Inherently antistatic foams can be made from a prepolymer comprising the reaction product of an oxyethylene-containing polyol and polyisocyanates. These foams can then be incorporated into packaging for electrostatic sensitive devices.

One embodiment of the invention is packaging containing foams prepared from a prepolymer described by U.S. Pat. No. 4,137,200 to Wood et al, the contents of which are incorporated herein by reference. The prepolymers described in the Wood patent are the reaction products of mixtures comprising (a) a first polyol having a hydroxyl functionality of at least 2 and a number average molecular weight range of 200 to 20,000 and which contains at least 40 mole percent oxyethylene, (b) a second polyol having a hydroxyl functionality in the range of about 3 to 8 and (c) a polyisocyanate having an average isocyanate functionality in the range of about 2.0 to 2.8.

The hydroxyl groups of the first and second polyols are capped by reaction with the polyisocyanate. This reaction may be carried out in an inert moisture-free atmosphere such as a nitrogen blanket, at atmospheric pressure at a temperature in the range of from about 0° C. to about 120° C. for a period of time of up to about 20 hours depending upon the temperature and degree of agitation. This reaction may be effected also under atmospheric conditions provided the reaction mixture is not exposed to excess moisture.

The first polyol is preferably a hydrophilic oxyalkylene polyol containing at least about 40%, and more preferably about 80 to 100%, oxyethylene. The balance should be oxypropylene, oxybutylene, etc. Suitable examples include random ethylene/propylene oxide oligomers which have a number average molecular weight in the range of about 1000-2500 and are hydrophilic, water soluble and liquid at room temperature.

Without being held to a particular theory, it is thought that the hydrophilic oxyethylene-containing backbone of the prepolymer is partially responsible for the antistatic properties exhibited by the resulting foams. Thus, an especially suitable first polyol is polyethylene glycol which contains about 100% oxyethylene and has a number average molecular weight of about 600-1500.

The second polyol provides crosslinking ability and is preferably a generally linear polyol having at least 3, and preferably between 3 and 8 hydroxyl groups. Usually monomeric polyols having 3 to 4 hydroxyl groups per mole are employed. A suitable example of the second polyol is trimethylolpropane. A suitable polyisocyanate mentioned in the '200 patent to Wood is toluene diisocyante. Other polyisocyanates which may be used include the following:

PAPI(a polyaryl polymethylenepolyisocyanate as defined in U.S. Pat. No. 2,683,730)
triphenylmethane-4,4',4"-triisocyanate,
benzene-1,3,5-triisocyanate,
toluene-2,4,6-triisocyanate,
diphenyl-2,4,4'-triisocyanate,
xylene diisocyanate,
chlorophenylene diisocyanate,
diphenylmethane-4,4'- diisocyanate,
naphthalene-1,5-diisocyanate,
xylene-alpha,3,3'-dimethyl-4,4'-biphenylene diisocyanate
3,3'-dimethoxy-4,4'-biphenylene diisocyanate,
2,2',5,5'-tetramethyl-4,4'-biphenylene diisocyanate,
4,4'-methylenebis(phenylisocyanate),
4,4'-sulfonylbis(phenylisocyanate),
4,4'-methylene di-orthotolylisocyanate, ethylene diisocyanate, trimethylenediisocyanate, isophorone diisocyanate, and 2,2,4- trimethyl-1,6-hexane diisocyanate.

Mixtures of any one or more of the above-mentioned organic isocyanates may be used as desired. Further, suitable mixtures can include combinations of dimers and trimers derived from diisocyanates such as those described above. Especially suitable isocyanates are those which are readily commercially available and have a high degree of isocyanate reactivity.

Prepolymers made from toluene diisocyanate are commercially available as HYPOLR ® polymers FHP 2000, 2002 and 3000 from W. R. Grace & Co.-Conn. These prepolymers are made from varying ratios of the first and second polyols with enough toluene diisocyanate to cap all of the hydroxyl groups. HYPOL polymers 2000 and 2002 demonstrate relatively better antistatic properties.

In addition to employing toluene diisocyanate capped prepolymers, prepolymers capped with dicyclohexylmethane-4,4'-diisocyanate [methylene bis(cyclohexyl isocyanate)] also result in a preferred foam for packaging static sensitive devices. In addition to antistatic properties, this foam possesses unique absorption and dimensional stability characteristics and is described in detail in U.S. Ser. No. 410,458 filed Sept. 21, 1989.

An embodiment which is especially preferred is packaging containing a foam made from hexamethylene diisocyanate (HDI). For instance, a foam produced from a prepolymer comprising a polyol blend of the first and second polyols capped with HDI demonstrates very good antistatic properties and clearly meets the static decay standards for packaging materials described in MIL-B-81705B. As described later, this embodiment is especially preferred because, in addition to the excellent antistatic properties, the HDI-based foam does not yellow and has excellent resiliency features.

To prepare the prepolymers described in the Wood patent, the polyols and polyisocyanate can be reacted by two methods described therein. Briefly, the first method involves first reacting a molar excess of polyisocyanates with each of the first and second polyols. Each of the isocyanate-containing polyols are then blended in various molar proportions so that the resulting product mixture has an average isocyanate functionality greater than two. Upon reacting the blend of the two isocyanate containing polyols with water, as described below, a crosslinked foam results.

The second method of preparing the prepolymer involves a post-addition step of isocyanate. Briefly, the first and second polyols are reacted in less than molar excess isocyanate and then later used to make foams by adding isocyanates and water. This method and the method in the above paragraph are described more fully in the '200 patent to Wood, the contents of which have been incorporated herein by reference.

Further, during either of the above two prepolymer forming reactions, it has been helpful to measure the isocyanate level by titration periodically during the reaction. From these periodic measurements, one can determine the theoretical point at which all the hydroxyl groups of the polyol (and crosslinking agent) will have reacted with an isocyanate. Thus, if the first method is being used and the theoretical point has not been reached, additional reaction time will be required. However, if the reaction is carried out too far, the viscosity of the resulting prepolymer increases to the point where it becomes difficult to mix the prepolymer with water.

Another useful embodiment can be packaging incorporating foams made from oxyethylene-containing, multifunctional polyols, e.g. triols, tetrols etc. Oxyethylene-containing triols can be prepared by polymerizing ethylene oxide in the presence of a polyfunctional hydroxyl-containing starter component, such as glycerol, trimethylolpropane or trimethylolethane. The molecular weight of these polymeric triols may be varied greatly, depending on the number of moles of ethylene oxide used in the reaction with the starter component. Starter components such as pentaerythritol and sucrose likewise treated with ethylene oxide lead to polymeric polyoxyethylene tetrols and hexols, respectively. Suitable examples of other oxyethylene-containing, multifunctional polyols, e.g. tetrols, which can be used to make inherently antistatic foams are found in the examples of U.S. Pat. Nos. 3,903,232 and 3,812,619 to Wood et al, the contents of which are incorporated herein by reference.

When using multifunctional polyols the prepolymers are prepared by reacting the hydroxyl groups of the triol with a polyisocyanate similar to the methods demonstrated in the '232 patent. See Examples 1–4 and 7 of the '232 patent.

To effect foaming of the prepolymer, the prepolymer is simply combined with particular aqueous components. These methods are well known in the art as the '200 patent to Wood indicates. Briefly, it is known that water (aqueous reactant) can be added in weight ratios of prepolymer:water in the range of about 0.1:1 to about 10:1. More preferable weight ratios are about 1:1 to about 4:1. For instance, when the prepolymer is capped with methylene bis(cyclohexyl isocyanate), foams suitable for this invention can be produced from a prepolymer:water weight ratio in the range of about 2:1 to 6:1. This results in a foam having a density ranging from about 0.02g/cc to 0.05g/cc.

Surfactants are generally added to the aqueous reactant to adjust the texture and appearance of the foam, i.e. such as the cell size, shape, etc., as well as to prevent the formation of splits in the resulting foam buns. However, the surfactant is not necessary to make a foam or to impart antistatic properties. See Example 8. When used, the surfactants are added in amounts ranging from 0.5% to about 8% by weight of the aqueous reactant. Examples of suitable surfactants include silicone-polyether copolymer surfactants such as L-520 or L-6202 from Union Carbide and DC-190, DC-198 or DC-1315 from Dow Corning. Fluorocarbon copolymers such as the Zonyl$^R$ from Dupont) or Fluorad$^R$ (from Minnesota Mining and Manufacturing) surfactant families can also be used. The polyether silicones are preferred when foams containing small fine cells are desired.

Straight chain primary alkoxylated alcohol surfactants can be used. They are available as Plurafac surfactants, e.g. B26, from BASF Corp.

Polyoxyethylene/polyoxypropylene block copolymer surfactants such as Pluronic$^R$ surfactants, also from BASF Corp., can also be used. The preferred Pluronic surfactants, e.g. L-62, L-92 and L-122, contain 20 percent or less by weight of polyoxyethylene and are preferably employed in 1–2% solution.

Tetrafunctional block copolymers derived from oxyethylene and oxypropylene which have been subsequently added to ethylenediamine are also suitable and commercially available as Tetronic surfactants, e.g. 1302 or 90R4, from BASF Corporation.

Other desirable surfactants include Brij 35 surfactant (polyoxyethylene-23 lauryl ether) from ICI, and Triton X-100 surfactant (polyoxyethylene-10 alkyl phenyl ether) from Rohm & Haas. The use of the surfactants discussed above and others are well known to one skilled in the art of foam formation.

It is also sometimes desirable to add a foaming catalyst to the aqueous reactant. Suitable catalysts include inorganic bases such as sodium bicarbonate or sodium carbonate and are added in amount equaling about 0.5 to 2.0% by weight of the aqueous reactant.

As discussed above, foams produced from prepolymers such as those described in the '200 patent to Wood show inherent antistatic properties. The antistatic properties were characterized by measurement of static decay time and surface resistivity. The static decay time was tested according to Federal test standard #101C, test method 4046 and U.S. Military Specification MIL-B-81705B, the contents of which are incorporated herein by reference. Briefly, the materials above are tested by applying a charge of 5000V on the material's surface and then measuring the amount of time required for complete dissipation of the charge to ground so that no more than 50V remain on the surface. Surface Resistivity was measured per ASTM D257 using (unless otherwise noted) a Model #150 surface resistivity meter from Trek, Inc., Medina, NY.

The term antistatic as used herein refers to material having either a static decay time of two seconds or less or a surface resistivity of about $1 \times 10^{12}$ ohm/square or less. The antistatic characteristics are illustrated by the results found in Tables 1 and 2.

The foams described above show excellent inherent antistatic properties not seen for other polyether polyurethane foams. See Example 1 and Table I of U.S. Pat. No. 3,933,697 to Fujii et al (foam produced from trifunctional polyether glycol and toluene diisocyanate). See Example 1 and Comparison Sample No. C-5 in U.S. Pat. No. 4,618,630 to Knobel (foam prepared from glycerine initiated polyether polyol and toluene diisocyanate); and Column 6, lines 37–49 of U.S. Pat. No. 4,605,684 to Pcolinsky, Jr. (foam prepared from a polyether copolymer (with styrene and acrylonitrile) and toluene diisocyanate).

The foams of the present invention also possess other advantageous properties. For instance, the antistatic properties remain constant over long periods of time, e.g. above 70 days at 12.5% relative humidity and 25° C., and also survives oven aging according to MIL-B-81705B. Further, by being inherently antistatic, the foams do not contain antistatic additives which tend to slough off from the foam during storage and contaminate the devices which are packaged with the foam. Embodiments using the foams prepared from the aliphatic polyisocyanate containing prepolymers do not yellow.

Even further, the foams prepared from HDI show substantial resiliency and should be quite useful for protecting and cushioning devices in their packages. For instance, the HDI-based foam demonstrated a ball rebound of 61 ± 2% according to ASTM 3574-H. See the foam prepared in Example 6. This test measures the height of the ball's vertical rebound from a slab of foam as a percentage of the height at which the ball was dropped. This result illustrates about a 20% increase in resiliency over one known antistatic foam. See U.S. Pat. No. 4,618,630 to Knobel et al, Column 10, Table IV.

Resiliency properties of foams used to pack electronic devices and components are important. For instance, a foam is sometimes used to secure the device or component in a package by fitting it snugly around the packaged device or component. In this type of packaging, the foam can be subjected to outside pressure, thus altering the foam's fit around the device or component so that there is no longer a snug fit. This momentary pressure thus increases the chance that the component can come loose inside the package. However, a substantially resilient foam can rebound to its original shape, after the pressure has been released, more quickly than "dead" foams which have high compression sets. Thus, the foam's resiliency decreases the time in which a piece could become loose within the package.

Finally, the foams do not cause corrosion, etching or pitting of certain metals when tested according to methods in MIL-B-81705B, paragraph 4.8.3., Federal Standards 101C, test method 3005. The foam subjected to this test was one prepared according to Example 6. The contents of test method 3005 are incorporated herein by reference.

As a result of the above findings, these foams can be very useful in packaging for electrostatic sensitive devices. Packaging for such devices is defined, for the purposes of this invention, as articles or structures which envelop the devices. These articles can serve the purpose of cushioning and protecting the devices from shock, moisture, harsh environments, etc. Such articles also include packaging used to transport devices from manufacturing to retailer and retailer to customer. Moreover, these articles can include structures used to house fully fabricated electrostatic sensitive devices. These uses may include sound deadening, surface vibration damping, thermal insulation, etc.

Likewise, articles which are placed in the environment surrounding the electrostatic devices could include such foams. Items such as rugs, drop cloths, wall padding, surgical drapes, etc. could incorporate such foams.

The above foams and their properties are illustrated by the following examples. However, the examples are only for illustrative purposes and are not intended in any way to limit the scope or spirit of the invention.

EXAMPLE 1

A foam was prepared from a mixture of HYPOL 2000 prepolymer, and an aqueous reactant containing 2% Pluronic L-62 surfactant. The ratio of water to prepolymer was about 1:1. After stirring well, a foam having density of about 0.13g/cc [8.26 lb/ft$^3$] was produced. A one-half inch thick sample was then cut from the bun and oven dried at 50° C. for 24 hours. Subsequently, the foam was placed in a humidity-controlled chamber at 12.5% Relative Humidity (RH) and about 25° C. for a minimum of twenty four hours to equilibrate. The results obtained from testing the foam's antistatic properties are illustrated in Table 1.

EXAMPLE 2

The method for preparing foams in Example 1 was used except Hypol 2002 prepolymer was used. The density of the foam was also 0.13g/cc [8.26 lb/ft$^3$]. The antistatic properties of the foam are illustrated in Table 1.

EXAMPLE 3

The method for preparing a foam in Example 1 was conducted except HYPOL 3000 prepolymer was used. The density of the foam was 0.09 g/cc [5.61 lb/ft$^3$] The antistatic properties of the foam are illustrated below in Table 1.

TABLE 1

| Example | Static Decay Time (secs) | Surface Resistivity (ohm/sq) |
|---|---|---|
| 1 | 1.08 | $2 \times 10^{11}$ |
| 2 | 1.67 | $5 \times 10^{10}$ |
| 3 | >5 | $1 \times 10^{11}$ |

EXAMPLE 4

A prepolymer was prepared according to the '200 patent to Wood et al using polyethylene glycol, trimethylol propane and isophorone diisocyanate. To produce a foam, the resulting prepolymer was added to an aqueous reactant containing 2% surfactant and 2% catalyst. A one half inch thick sample was cut from the bun, oven dried at 50° C and then placed in a humidity-controlled chamber at 12.5% RH and 25° C for 48 hours to equilibrate. The antistatic properties for foams made with various surfactants and prepolymer:water ratios are found in Table 2.

EXAMPLE 5

A mixture of 500g (0.5 moles) of polyethylene glycol and 33.5g (0.25 moles) of trimethylolpropane was degassed by heating for two hours @70° C. and about 2 Torr. To this was added 542g (2.07 moles, 18% excess) of Desmodur W, i.e. methylene bis(cyclohexyl isocyanate). The temperature was raised to 70° C. and 0.5g of a catalyst, stannous octoate, was added. After 35 minutes, the isocyanate content of the reaction product was 2.19 meq/g and the product was poured into a bottle for storage. After a few days at ambient temperature, the isocyanate content and viscosity had stabilized at 2.00 meq/g and 73,000 cp at 25° C.

Various foams were made from the prepolymer prepared above by mixing the prepolymer with water containing 2% catalyst and 2% surfactant. The dried foams have a fine-celled structure and densities of about 0.031 g/cc. A one-half inch thick sample was cut from the bun, oven dried and then placed in a humidity-controlled chamber at 12.5% RH and 25° C. The antistatic properties for the various foams made from this polyisocyanate and various surfactants and prepolymer:water ratios are found in Table 2.

EXAMPLE 6

1000.0g of Carbowax 600 (polyethylene glycol of MW 600 from Union Carbide Corporation) and 62.6 g of trimethylolpropane (Aldrich) were mixed under agitation and vacuum at 70° C. to remove water. The vacuum was removed and the stirred vessel containing the polyols was kept over nitrogen and maintained at 70° C. To this mixture, 855.0g of Desmodur H (hexamethylene diisocyanate or HDI from Mobay Chemical Co.) was added. After approximately one hour, the isocyanate concentration was measured by titration to be 4.8 meq/g. After 21 hours at 70° C., the isocyanate content of the mixture was 2.76 meq/g, which was slightly below the 2.84 meq/g predicted by theory, probably due to a slight amount of residual water in the mixture. The product was a clear liquid and had a viscosity of 2,300 cps.

The resulting prepolymer was added to an aqueous reactant containing 2% surfactant and 2% catalyst to produce a foam. After stirring well, a highly resilient, cellular product was made that, when cured and removed of water, had a density of 0.0374 g/cc. A one half inch thick sample was cut from the bun, oven dried at 50° C. and then placed in a humidity-controlled chamber at 12.5% RH and 25° C. for 48 hours to equilibrate. The antistatic properties for the foam made with various surfactants and prepolymer:water ratios are found in Table 2.

EXAMPLE 7

Another prepolymer was prepared from HDI, except a polyethylene glycol having a molecular weight of about 1000 was used. Specifically, 500g of PEG 1000 and 18.8g of trimethylolpropane were mixed under agitation and vacuum at 70° C. to remove water. The vacuum was removed and the polyols were maintained over nitrogen at 70° C. To this mixture, 256.5 of HDI was added. After about twenty-one hours at 70° C., the isocyanate content of the mixture was about 1.99 meq/g. The prepolymer was a waxy solid at room temperature.

A foam was made from this prepolymer by heating to above its melting point, i.e. less than 70° C., and then mixing with aqueous reactant according to Example 6. The resulting foam had a density of 0.052g/cc. The antistatic properties of this foam are also illustrated in Table 2.

TABLE 2

| Example | Weight Ratio (pp:aq)[1] | Surfactant/Catalyst[2] | Static Decay Time (sec) | Surface Resistivity (ohm/sq) |
|---|---|---|---|---|
| 4 | 2:1 | Pluronic F-88/NaHCO$_3$ | 0.06 | $7.0 \times 10^9$ |
| 4 | 2:1 | Pluronic P-75/NaHCO$_3$ | 0.05 | $7.0 \times 10^9$ |
| 4 | 2:1 | Pluronic P-75/Na$_2$CO$_3$ | 0.04 | $7.0 \times 10^9$ |
| 4 | 4:1 | Pluronic L-62/NaHCO$_3$ | 0.05 | $5.0 \times 10^9$ |
| 5 | 2:1 | Pluronic L-62/NaHCO$_3$ | 0.49 | $4.0 \times 10^{10}$ |
| 5 | 3:1 | Pluronic L-62/NaHCO$_3$ | 1.58 | $2.0 \times 10^{10}$ |
| 5 | 4:1 | Pluronic L-62/NaHCO$_3$ | 1.45 | $2.0 \times 10^{11}$ |
| 5 | 3:1 | DC-1315/NaHCO$_3$ | 1.52 | $2.2 \times 10^{11}$ |
| 5 | 3:1 | Plurafac B26/NaHCO$_3$ | 1.16 | $1.0 \times 10^{11}$ |
| 5 | 3:1 | Triton X-100/NaHCO$_3$ | 1.78 | $2.0 \times 10^{11}$ |
| 5 | 3:1 | Tetronic 1302/NaHCO$_3$ | 1.67 | $2.0 \times 10^{11}$ |
| 5 | 3:1 | Tetronic 90R4/NaHCO$_3$ | 1.30 | $1.5 \times 10^{11}$ |
| 5 | 3:1 | Brij 35/NaHCO$_3$ | 1.39 | $1.8 \times 10^{11}$ |
| 5 | 3:1 | 8% DC-190/2% NaHCO$_3$ | 1.32 | $2.0 \times 10^{11}$ |
| 5 | 3:1 | 8% L-6202/2% NaHCO$_3$ | 2.05 | $2.2 \times 10^{11}$ |
| 5 | 2:1 | Pluronic 25R2/NaHCO$_3$ | 0.45 | $6.0 \times 10^{10}$ |
| 6 | 3:1 | Pluronic L-62/Na$_2$CO$_3$ | 0.06 | $5.0 \times 10^9$ |
| 6 | 3:1 | Sodium lauryl sulfate/Borax | 0.03 | $1.0 \times 10^9$ |
| 6 | 3:1 | Pluronic L-62/NaHCO$_3$ | 0.06 | $5.0 \times 10^9$ |
| 6 | 4:1 | Pluronic L-62/Borax | 0.11 | $8.0 \times 10^9$ |
| 7 | 2:1 | Pluronic L-62/NaHCO$_3$ | 0.02 | $1.0 \times 10^9$ |

[1] pp:aq = prepolymer to aqueous reactant weight ratio
[2] the surfactant and catalyst are present in the aqueous reactant at 2% weight concentrations except as noted in the table.

EXAMPLE 8

A foam was made according to the general procedure of Example 1, but using 50g of Hypol 2002 prepolymer and 50g of a surfactant-free aqueous reactant. This resulted in a coarse foam having a density of 0.19 g/cc. Surface resistivity and static decay time were measured at 12.5% RH as described in Example 1, and found to be $2 \times 10^{11}$ ohms/square and 1.85 seconds, respectively.

This example demonstrates that surfactant need not be present in the aqueous reactant in order to achieve desirable antistatic properties, i.e., the foam of this example is inherently antistatic.

EXAMPLE 9

Foam samples prepared according to Examples 5 and 6 were subjected to oven aging as per MIL-B-81705B. This involved heating a 3" × 5" × ½" sample at 70° C. for 12 days, then placing the sample in a humidity controlled chamber at 12.5% RH for 24 hours before taking measurements. The control for both Examples 5 and 6 was a foam stored at ambient conditions, 25° C. and 50% RH. The results are shown below:

TABLE 3

| Foam | Surface Resistivity* | Static Decay |
|---|---|---|
| Example 5 (oven aged) | $1.56 \times 10^{12}$ | 0.33 sec |
| Example 5 (Control) | $1.68 \times 10^{12}$ | 0.28 sec. |
| Example 6 (oven aged) | $1.6 \times 10^{10}$ | 0.02 sec. |
| Example 6 | $9.0 \times 10^{10}$ | 0.03 sec. |

TABLE 3-continued

| Foam | Surface Resistivity* | Static Decay |
| --- | --- | --- |
| (Control) | | |

*Surface Resistivity for these foams were measured by a "Milli-to-2" surface/volume resistivity meter connected to a Monroe Electronics, Inc. Model 96071 electrode using 100 V applied.

We claim:

1. A method for protecting static sensitive environments, electronic components or devices from static electricity comprising packing, installing or storing the component with a foam which possesses inherent antistatic properties wherein the foam is derived from a reaction mixture comprising (a) a first polyol having a number average molecular weight in the range of 200 to 20,000 and which contains at least 40 mole percent oxyethylene, (b) a second polyol having a hydroxyl functionality in the range of about 3 to 8 and (c) a polyisocyanate having an average isocyanate functionality in the range of about 2.0 to 2.8.

2. A method according to claim 1 wherein the isocyanate containing polyurethane prepolymer is prepared from a reaction mixture comprising (a) a first polyol having a number average molecular weight in the range of 200 to 20,000 and which contains at least 40 mole percent oxyethylene, (b) a second polyol having a hydroxyl functionality int he range of about 3 to 8 and (c) a polyisocyanate selected form the group comprising toluene diisocyanate,
hexamethylene diisocyanate,
methylene bis(cyclohexyl isocyanate),
hexamethylene diisocyanate,
PAPI,
triphenylmethane-04,4',4"-triisocyanate,
benzene-1,3,5-triisocyanate,
toluene-2,4,6-triisocyanate,
diphenyl-2,4,4,'-triisocyanate,
xylene diisocyanate,
chlorophenylene diisocyanate,
diphenylmethane-4,4'-diisocyanate,
naphthalene-1,5-diisocyanate,
xylene-alpha,3,3'-dimethyl-4,4'-biphenylene diisocyanate,
3,3'-dimethoxy-4,4'-biphenylene diisocyanate,
2,2',5,5'-tetramethyl-4,4'-biphenylene diisocyanate,
4,4'-sulfonylbis(phenylisocyanate),
4,4'-methylene di-orthotolylisocyanate,
ethylene diisocyanate,
trimethylenediisocyanate,
isophorone diisocyanate, and
2,2,4-trimethyl-1,6-hexane diisocyanate, or dimers and trimers derived from any one or more of the above and having an average isocyanate functionality in the range of about 2.0 to 2.8.

3. A method according to claim 1 wherein the oxyethylene containing polyol has about 80–100 mole percent oxyethylene.

4. A method according to claim 1 wherein (a) is polyethylene glycol, (b) is trimethylolpropane and (c) is toluene diisocyanate.

5. A method according to claim 4, wherein (c) contains, in addition, methylene bis(cyclohexyl isocyanate).

6. A method according to claim 1, wherein (a) is polyethylene glycol, (b) is trimethylolpropane and (c) is isophorone diisocyanate.

7. A method according to claim 1 wherein (a) is polyethylene glycol, (b) is trimethylolpropane and (c) is methylene bis(cyclohexyl isocyanate).

8. A method according to claim 1 wherein (a) is polyethylene glycol, (b) is trimethylolpropane and (c) is hexamethylene diisocyanate.

9. A method according to claim 1 or 2 wherein the foam has a surface resistivity of about $1.0 \times 10^{12}$ ohms/square or less.

10. A method according to claim 1 wherein a static charge of 5000V dissipates to less than 50V from said foam in about two seconds or less at a relative humidity of about 12%.

11. A method according to claim 6 or 8 wherein the 5000V static charge dissipates to less than 50V from said foam in about 0.1 second or less at a relative humidity of about 12%.

12. A method according to claim 1 wherein the isocyanate containing polyurethane prepolymer is prepared from a reaction mixture comprising (a) a first polyol having a number average molecular weight int he range of 200 to 20,000 and which contains at least 40 mole percent oxyethylene, (b) a second polyol having a hydroxyl functionality int he range of about 3 to 8 (c) a polyisocyanate selected from the group comprising toluene diisocyanate,
hexamethylene diisocyanate,
methylene bis(cyclohexyl isocyanate),
hexamethylene diisocyanate,
diphenylmethane-4,4'-diisocyanate,
isophorone diisocyanate, and mixtures thereof, and having an average isocyanate functionality in the range of about 2.0 to 2.8.

13. A method according to claim 1 wherein the isocyanate containing polyurethane prepolymer is prepared from a reaction mixture comprising (a) a first polyol having a number average molecular weight in the range of 200 to 20,000 and which contains at least 40 mole percent oxyethylene, (b) a second polyol having a hydroxyl functionality int he range of about 3 to 8 and hexamethylene diisocyanate.

14. A method according to claim 8 or 13 wherein the foam used is substantially resilient.

15. In an article for packaging static sensitive devices, the improvement comprising incorporating a foam which possesses inherent antistatic properties and which is prepared from a reaction mixture comprising (a) a first polyol having a hydroxyl functionality of at least 2 and a number average molecular weight in the range of 200 to 20,000 and which contains at least 40 mole percent oxyethylene, (b) a second polyol having a hydroxyl functionality int he range of about 3 to 8 and (c) a polyisocyanate having an average isocyanate functionality in the range of about 2.0 to 2.8.

16. Article according to claim 15 wherein (a) is polyethylene glycol, (b) is trimethylolpropane and (c) is toluene diisocyanate.

17. Article according to claim 15 wherein (c) contains, in.addition, methylene bis(cyclohexyl isocyanate).

18. Article according to claim 15 wherein (a) is polyethylene glycol, (b) is trimethylolpropane and (c) is isophorone diisocyanate.

19. Article according to claim 15 wherein (a) is polyethylene glycol, (b) is trimethylolpropane and (c) is methylene bis(cyclohexyl isocyanate).

20. Article according to claim 15 wherein (a) is polyethylene glycol, (b) is trimethylolpropane and (c) is hexamethylene diisocyanate.

* * * * *

UNITED STATES PATENT AND TRADEMARK OFFICE
CERTIFICATE OF CORRECTION

PATENT NO. : 5,096,934
DATED : March 17, 1992
INVENTOR(S) : Roberts et al.

It is certified that error appears in the above-identified patent and that said Letters Patent is hereby corrected as shown below:

Column 11, line 30, Claim 2: delete "form" and add -- from --.

Column 12, line 24, Claim 12: after "3 to 8" add -- and --.

Signed and Sealed this

Fourth Day of May, 1993

Attest:

Attesting Officer

MICHAEL K. KIRK

Acting Commissioner of Patents and Trademarks